(12) United States Patent
Kim et al.

(10) Patent No.: US 10,879,493 B2
(45) Date of Patent: Dec. 29, 2020

(54) DISPLAY DEVICE

(71) Applicant: SAMSUNG DISPLAY CO., LTD., Yongin-si (KR)

(72) Inventors: Hwan Jin Kim, Hwaseong-si (KR); Gyeong Sang Park, Mungyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/216,243

(22) Filed: Dec. 11, 2018

(65) Prior Publication Data

US 2019/0296266 A1    Sep. 26, 2019

(30) Foreign Application Priority Data

Mar. 22, 2018  (KR) .................. 10-2018-0033140

(51) Int. Cl.
| | |
|---|---|
| *G06F 3/041* | (2006.01) |
| *H01L 51/52* | (2006.01) |
| *G06K 9/20* | (2006.01) |
| *G06K 9/00* | (2006.01) |
| *H01L 51/00* | (2006.01) |
| *H05K 1/18* | (2006.01) |
| *H05K 1/14* | (2006.01) |
| *H01L 27/32* | (2006.01) |

(52) U.S. Cl.
CPC .......... *H01L 51/5275* (2013.01); *G06F 3/041* (2013.01); *G06K 9/0004* (2013.01); *G06K 9/00604* (2013.01); *G06K 9/2036* (2013.01); *H01L 27/32* (2013.01); *H01L 51/0097* (2013.01); *H05K 1/147* (2013.01); *H05K 1/189* (2013.01); *G06F 2203/04102* (2013.01); *G06K 9/0008* (2013.01); *H05K 2201/056* (2013.01); *H05K 2201/058* (2013.01); *H05K 2201/10128* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 2008/0121442 A1* | 5/2008 | Boer ................ | G06F 3/0421 178/18.09 |
| 2011/0122071 A1* | 5/2011 | Powell .............. | G06F 3/0412 345/173 |
| 2017/0372114 A1* | 12/2017 | Cho .................. | G01J 1/0233 |
| 2018/0067245 A1* | 3/2018 | Giachino ........... | G01J 1/0418 |

FOREIGN PATENT DOCUMENTS

KR    10-2017-0094059       8/2017

* cited by examiner

*Primary Examiner* — Carl Adams
(74) *Attorney, Agent, or Firm* — F. Chau & Associates, LLC

(57) ABSTRACT

A display device includes a display panel that includes a display area and a non-display area that surrounds the display area; a selective light-transmitting layer disposed under the display panel that blocks visible light and transmits infrared light; a panel bottom sheet disposed under the selective light-transmitting layer that includes a first opening in the display area that exposes the selective light-transmitting layer; and a first infrared sensor inserted in the first opening.

20 Claims, 12 Drawing Sheets

DISPLAY DEVICE

CROSS-REFERENCE TO RELATED APPLICATION

This application claims priority under 35 U.S.C. § 119 from, and the benefit of, Korean Patent Application No. 10-2018-0033140, filed on Mar. 22, 2018 in the Korean Intellectual Property Office, the contents of which are herein incorporated by reference in their entirety.

BACKGROUND

1. Technical Field

Embodiments of the present disclosure are directed to a display device.

2. Discussion of the Related Art

A display device, which is a device for displaying an image, can be incorporated into various products, such as smart phones. Recently, as display devices have various functions, many display devices also include optical sensors such as a fingerprint recognition sensor, an iris recognition sensor, or a proximity sensor.

For example, the optical sensor may be an infrared light sensor. An infrared light sensor include a light emitting unit that emits infrared light and a sensor that receives infrared light, and performs a sensing function by measuring the time taken by the emitted infrared light to be received through the sensor.

An optical sensor may be directly disposed under a window, or may be disposed under a display panel. When an optical sensor is disposed under a display panel, a non-display area for disposing the optical sensor decreases, and thus a bezel can be reduced. To prevent the sensing function from deteriorating, an opening is formed in a light-blocking layer under the display panel, and the optical sensor is disposed to overlap the opening.

However, in this case, there is a possibility that external reflected light received through the opening is visually recognized, which can deteriorate the aesthetics of the display device.

SUMMARY

Embodiments of the present disclosure can provide a display device in which external reflected light is not visually recognized without interfering with transmission and reception of an optical signal.

However, features of embodiments of the present disclosure are not restricted to those set forth herein. The above and other features of embodiments of the present disclosure will become more apparent to one of ordinary skill in the art to which the present disclosure pertains by referencing the detailed description of exemplary embodiments of the present disclosure given below.

According to an embodiment, a display device includes a display panel that includes a display area and a non-display area that surrounds the display area; a selective light-transmitting layer disposed under the display panel that blocks visible light and transmits infrared light; a panel bottom sheet disposed under the selective light-transmitting layer that includes a first opening in the display area that exposes the selective light-transmitting layer; and a first infrared sensor inserted in the first opening.

According to an embodiment, a display device includes a display panel that includes a flat portion and a bendable portion around the flat portion; a selective light-transmitting layer disposed under the display panel that overlaps the flat portion, blocks visible light and transmits infrared light; a panel bottom sheet disposed under the selective light-transmitting layer that includes an opening in the flat portion that exposes the selective light-transmitting layer; and an infrared sensor inserted in the opening.

According to an embodiment, a display device includes a selective light-transmitting layer that blocks visible light and transmits infrared light; a panel bottom sheet disposed under the selective light-transmitting layer that includes a first opening that exposes the selective light-transmitting layer; a first infrared sensor inserted in the first opening, and a flexible circuit board disposed under the panel bottom sheet, wherein the first infrared sensor is mounted on the flexible circuit board.

DETAILED DESCRIPTION OF EXEMPLARY EMBODIMENTS

Features of the inventive concept and methods of accomplishing the same may be understood more readily by reference to the following detailed description of exemplary embodiments and the accompanying drawings. Embodiments of the inventive concept may, however, be embodied in many different forms and should not be construed as being limited to the exemplary embodiments set forth herein. Like reference numerals may refer to like elements throughout the specification.

It will be understood that when an element or layer is referred to as being "on", "connected to" or "coupled to" another element or layer, it can be directly on, connected or coupled to the other element or layer or intervening elements or layers may be present.

Hereinafter, embodiments of the present disclosure will be described with reference to the attached drawings.

A display device, which is a device for displaying a moving image or a still image, can be used as a display screen of various products such as televisions, notebook computers, monitors, billboards, things of internet, as well as portable electronic appliances such as mobile phones, smart phones, tablet personal computers, (tablet PCs), smart watches, watch phones, mobile communication terminals, electronic notebooks, electronic books, portable multimedia players (PMPs), navigators, or ultra mobile PCs (UMPCs). Examples of a display device include an organic light emitting display (OLED), a liquid crystal display (LCD), a plasma display (PDP), a field emission display (FED), or an electrophoretic display (EPD).

Hereinafter, an organic light emitting display device will be described as an example of a display device, but embodiments of the present disclosure are not limited thereto.

Figure 1:
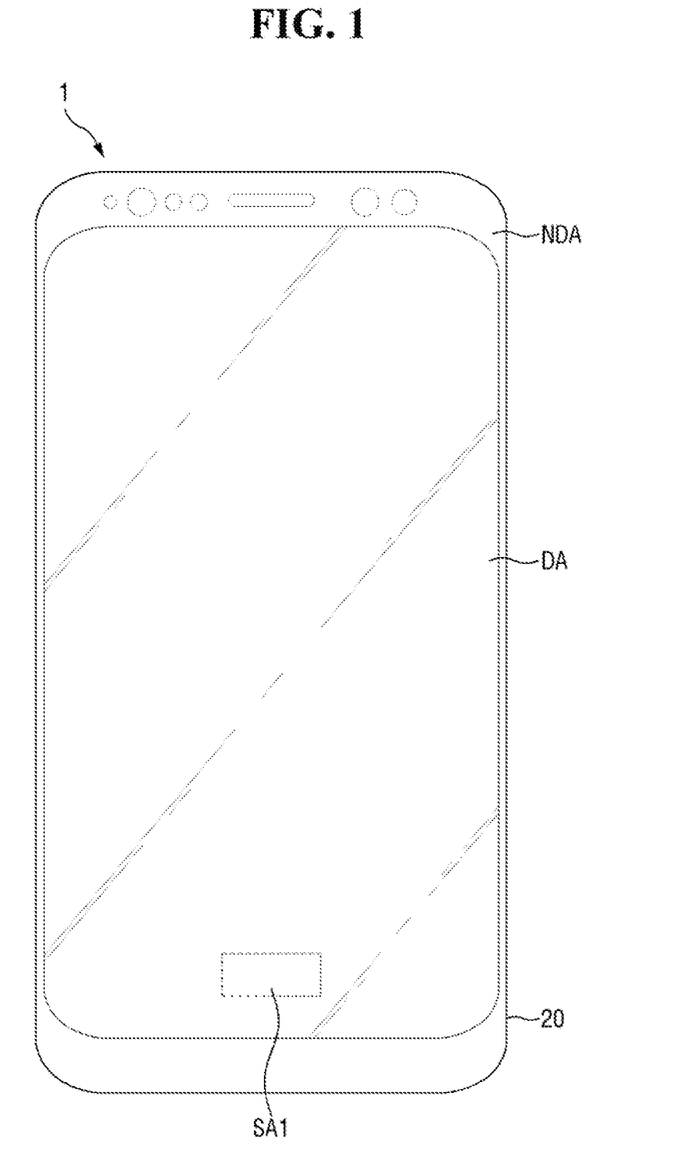
FIG. 1 is a plan view of a display device according to an embodiment.

FIG. 1 is a plan view of a display device according to an embodiment.

Referring to FIG. 1, a display device 1 includes a display area DA and a non-display area NDA disposed around the display area DA.

According to an embodiment, the display area DA is an area for displaying an image. The display area DA has a planar rectangular shape or a planar rectangular shape having rounded corners. However, the shape of the display area DA is not limited to a rectangle, and may have various shapes, such as a circle, an ellipse, etc.

According to an embodiment, the non-display area NDA is disposed around the display area DA. The non-display area NDA constitutes an edge of the display device 1. In an embodiment, a front camera, an iris recognition sensor, a proximity sensor, etc., can be disposed in the non-display area NDA.

According to an embodiment, the display area DA includes a first sensing area SA1.

Hereinafter, components of the display device 1 will be described in more detail with reference to FIGS. 2 and 3.

Figure 2:
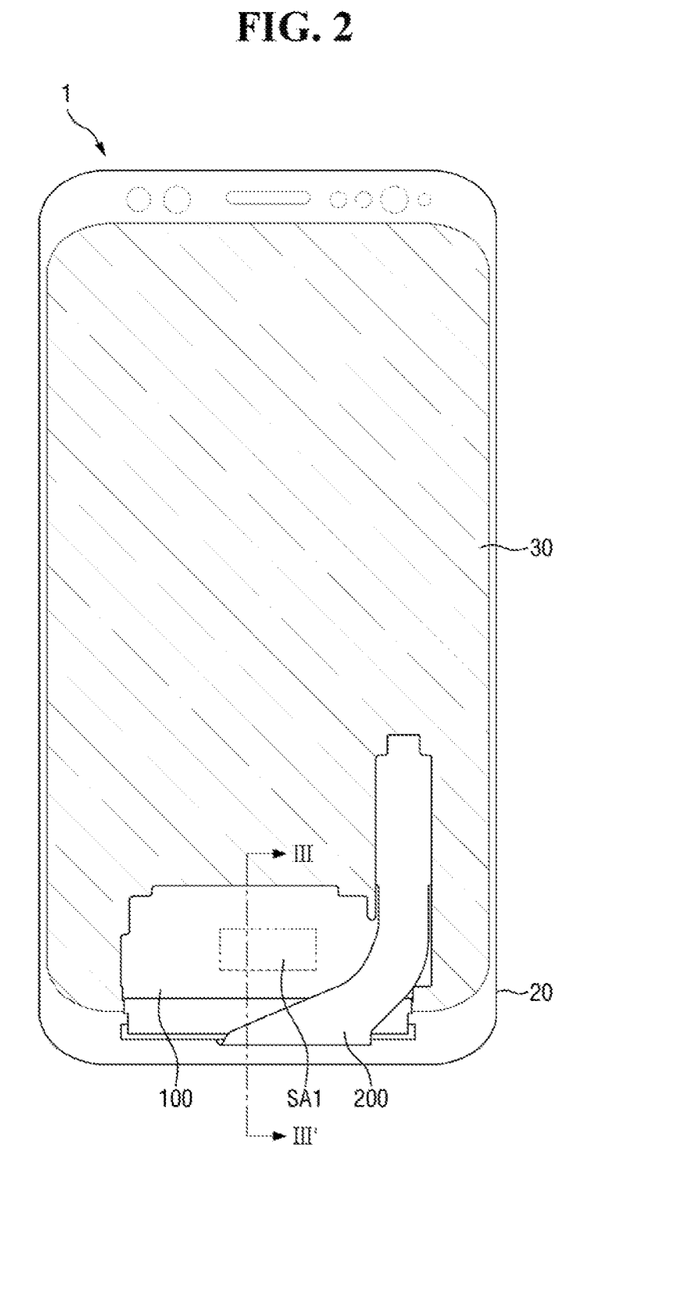
FIG. 2 is a rear view of a display device according to an embodiment.
Figure 3:
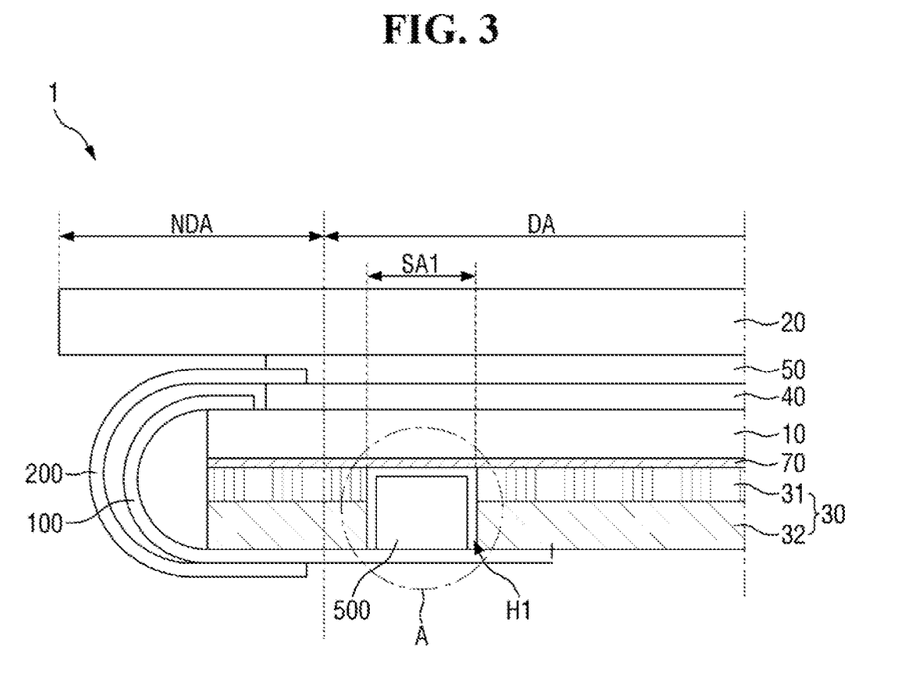
FIG. 3 is a cross-sectional view taken along line III-III' of FIG. 2.

FIG. 2 is a rear view of a display device according to an embodiment, and FIG. 3 is a cross-sectional view taken along line III-II' of FIG. 2.

Referring to FIGS. 2 and 3, according to an embodiment, the display device 1 includes a display panel 10, a window 20 disposed over the display panel 10, and a panel bottom sheet 30 disposed under the display panel 10.

According to an embodiment, unless defined otherwise, in this specification, the terms "upper" and "upper surface" refer to a side of a display surface with respect to the display panel 10, and the terms "lower" and "lower surface" refer to an opposite side of the display surface with respect to the display panel 10.

According to an embodiment, the display panel 10 includes a plurality of organic light emitting elements arranged on a substrate. The substrate may be a rigid substrate made of glass, etc., or may be a flexible substrate made of polyimide, etc. When the substrate is a polyimide substrate, the display panel 10 can be bent, warped, folded, or rolled.

According to an embodiment, the window 20 is disposed over the display panel 10. The window 20 can protect the display panel 10 and transmit light emitted from the display panel 10.

According to an embodiment, the window may include transparent glass, or may include a transparent material such as polyethylene terephthalate, polyvinyl resin, or polyester. However, embodiments of the present disclosure are not limited thereto, and the type of window 20 is not limited as long as it has sufficient transmittance to transmit light emitted from the display panel 10.

According to an embodiment, the window 20 overlaps the display panel 10 and covers the entire surface of the display panel 10. The window 20 is larger than the display panel 10. For example, the window 20 protrudes outward from the display panel 10 at both short sides of the display device 1. The window 20 may also protrude outward from the display panel 10 at both long sides of the display device 1. However, the protrusion distance of the window 20 at the short sides of the display device 1 is greater than the protrusion distance of the window 20 at the long sides of the display device 1.

According to an embodiment, a touch panel 40 is further disposed between the display panel 10 and the window 20. The touch panel 40 is disposed on the entire surface of the display panel 10. That is, the touch panel 40 has substantially the same size as the display panel 10, and overlaps the display panel 10.

In an embodiment, the touch panel 40 is directly formed on the display panel 10. For example, the touch panel 40 can be formed by disposing a touch electrode on a passivation layer of the display panel 10. In another embodiment, the touch panel 40 can be fabricated separately from the display panel 10, and then disposed on the display panel 10. In this case, the display panel 10 and the touch panel 40 can be attached to each other by an optical clear adhesive (OCA), an optical clear resin (OCR), etc.

According to an embodiment, the touch panel 40 and the window 20 are attached to each other by an adhesive member 50 such as an optical clear adhesive (OCA) or an optical clear resin (OCR).

According to an embodiment, a first flexible circuit board 100 and a second flexible circuit board 200 are disposed at one side of the display panel 10 and the touch panel 40. Specifically, the first flexible circuit board 100 and the second flexible circuit board 200 are disposed in the non-display area NDA adjacent to the first sensing area SA1 of the display area DA.

According to an embodiment, the first flexible circuit board 100 is mounted with a driving chip that drives the display panel 10, and is attached to one side of the display panel 10 to electrically connect the driving chip and the display panel 10.

According to an embodiment, the second flexible circuit board 200 provides a signal that drives the touch panel 40. The second flexible circuit board 200 is mounted with a driving chip that drives the touch panel 40, and is electrically connected with the first flexible circuit board 100.

According to an embodiment, one side of the first flexible circuit board 100 is attached to the upper surface of the display panel 10, and the other side thereof is disposed to face the lower surface of the display panel 10. That is, the first flexible circuit board 100 is bent from the upper surface of the display panel 10 to the lower surface of the display panel 10, and the other side of the first flexible circuit board 100 is disposed on the lower surface of the panel bottom sheet 30.

According to an embodiment, the second flexible circuit board 200, similarly to the first flexible circuit board 100, is also bent outward. That is, one side of the second flexible circuit board 200 is attached to the upper surface of the touch panel 40, and the other side thereof is disposed to face the lower surface of the touch panel 40.

According to an embodiment, a selective light-transmitting layer 70 is disposed beneath the display panel 10. The selective light-transmitting layer 70 blocks light having a visible wavelength (380 nm to 780 nm), but transmits light having an infrared wavelength (850 nm to 1000 nm).

According to an embodiment, the selective light-transmitting layer 70 has substantially the same size as the display panel 10, and overlaps the display panel 10. In an embodiment, the selective light-transmitting layer 70 is formed directly on the lower surface of the display panel 10 in the form of a print layer. For example, the selective light-transmitting layer 70 is formed on the lower surface of the display panel 10 by a method such as silk printing. In this case, the selective light-transmitting layer 70 and the display panel 10 are in direct contact with each other without a separate adhesive member.

In another embodiment, the selective light-transmitting layer 70 is provided in the form of a film. This will be described below with reference to FIG. 7.

According to an embodiment, the selective light-transmitting layer 70 includes a material that has a high infrared transmittance where the wavelength of light is greater than about 780 nm but has a low visible transmittance where the wavelength of light is between about 380 nm and about 780 nm. For example, the selective light-transmitting layer 70 includes epoxy or acryl, but embodiments of the present disclosure are not limited thereto.

According to an embodiment, the panel bottom sheet 30 is disposed beneath the selective light-transmitting layer 70. The panel bottom sheet 30 has substantially the same size as the display panel 10 and overlaps the display panel 10, and the side surface of the panel bottom sheet 30 is aligned with the side surface of the display panel 10, but embodiments of the present disclosure are not limited thereto. The panel bottom sheet 30 is attached to the lower surface of the selective light-transmitting layer 70 by an adhesive member.

According to an embodiment, the panel bottom sheet 30 can perform a heat radiating function, an electromagnetic wave blocking function, a pattern visibility preventing function, a grounding function, a buffering function, a strength enhancing function, or a digitizing function. The panel bottom sheet 30 includes a functional layer having at least one of the above-described functions. The functional layer can be provided in various forms, such as a layer, a film, a film, a sheet, a plate, or a panel.

According to an embodiment, the panel bottom sheet 30 may include one functional layer or a plurality of functional layers. If the panel bottom sheet 30 includes a plurality of functional layers, the functional layers are laminated to overlap each other. One functional layer may be laminated immediately on another functional layer, or may be disposed thereover through a bonding layer.

According to an embodiment, the panel bottom sheet 30 includes a first functional layer 31 and a second functional layer 32, which are sequentially laminated. However, embodiments of the present disclosure are not limited thereto, and the panel bottom sheet 30 may include three or more functional layers.

According to an embodiment, the first functional layer 31 is a buffer member that alleviates external impacts. That is, the first functional layer 31 can absorb a part of an impact applied to the display device 1, thereby preventing damage to the display device 1.

According to an embodiment, the first functional layer 31 may be formed of a polymer resin, such as polyurethane, polycarbonate, polypropylene, or polyethylene, or may be formed of a sponge formed by foaming a rubber liquid, a urethane-based material or an acrylic material.

According to an embodiment, the second functional layer 32 performs a digitizer function. The digitizer is an input device, and receives position information from a user via a screen, unlike an input device such as a keyboard or a mouse. For example, the second functional layer 32 recognizes the movement of a stylus pen and converts this recognized movement into a digital signal.

According to an embodiment, the panel bottom sheet 30 includes a first opening H1. The first opening H1 overlaps the first sensing area SA. The first opening H1 penetrates the panel bottom sheet 30 and exposes the lower surface of the selective light-transmitting layer 70.

According to an embodiment, a first infrared sensor 500 is disposed in the first opening H1. The first infrared sensor 500 directly faces the selective light-transmitting layer 70. The first infrared sensor 500 is, for example, a fingerprint recognition sensor that uses infrared light. However, embodiments of the present disclosure are not limited thereto, and the first infrared sensor 500 may be any product that performs a sensing function using infrared light.

Hereinafter, the first infrared sensor 500 and the selective light-transmitting layer 70 will be described with reference to FIGS. 4 and 5.

Figure 4:
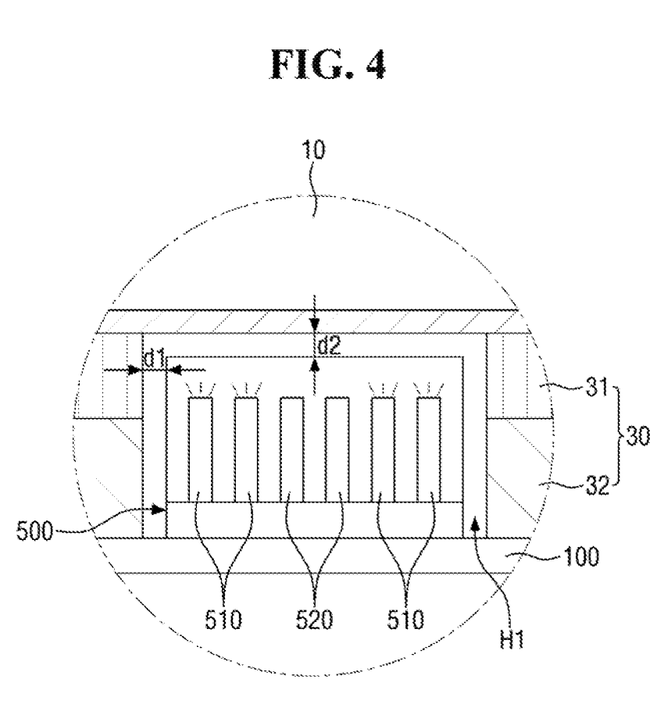
FIG. 4 is an enlarged cross-sectional view of region A in FIG. 3.

FIG. 4 is an enlarged cross-sectional view of region A in FIG. 3. FIG. 5 is a cross-sectional view that shows the optical path when a selective light-transmitting layer is disposed on a first infrared sensor.

Figure 5:
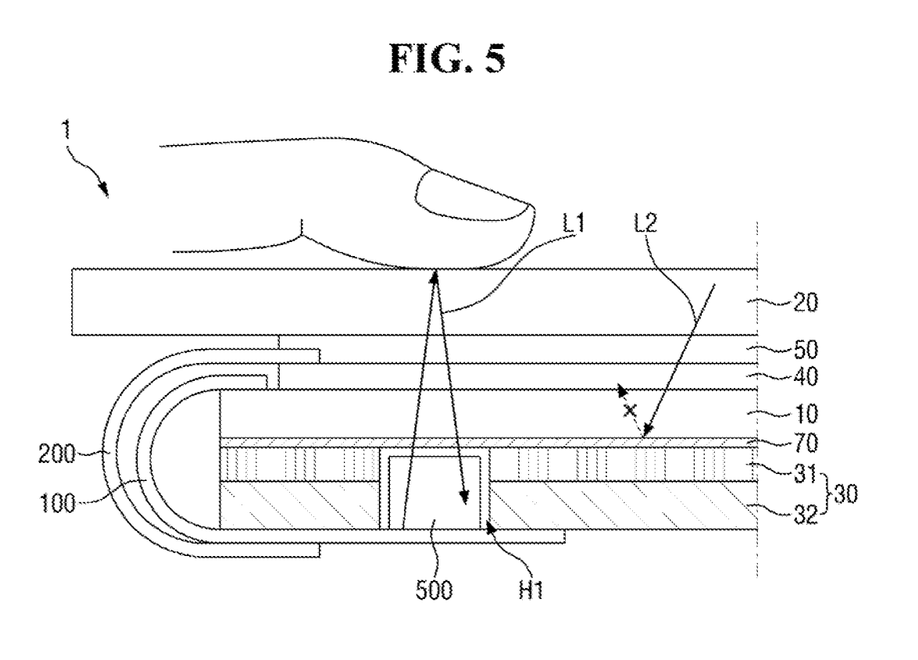
FIG. 5 is a cross-sectional view that shows the optical path when a selective light-transmitting layer is disposed on a first infrared sensor.

Referring to FIGS. 4 and 5, according to an embodiment, the first infrared sensor 500 is fixed on the first flexible circuit board 100. For example, the first infrared sensor 500 is fixed on the first flexible circuit board 100 by soldering.

According to an embodiment, the first infrared sensor 500 is spaced apart from an inner side wall of the panel bottom sheet 30 and a lower surface of the selective light-transmitting layer 70. In other words, the size of the first opening H1 formed in the panel bottom sheet 30 is larger than the size of the first infrared sensor 500.

According to an embodiment, a first distance d1 between the first infrared sensor 500 and the inner side wall of the panel bottom sheet 30 is from about 0.1 mm to about 0.5 mm. A second distance d2 between the first infrared sensor 500 and the selective light-transmitting layer 70 is from about 0.1 mm to about 0.5 mm. According to an embodiment, each of the first distance d1 and the second distance d2 is from about 0.2 mm to about 0.3 mm.

According to an embodiment, when each of the first distance d1 and the second distance d2 is greater than or equal to 0.1 mm, or greater than or equal to 0.2 mm, the first infrared sensor 500 is not in direct contact with the panel bottom sheet 30 or the selective light-transmitting layer 70, thereby preventing damage to the first infrared sensor 500. When each of the first distance d1 and the second distance d2 is 0.5 mm or less, or 0.3 mm or less, the display device can be made slim and small.

According to an embodiment, the first infrared sensor 500 includes a light emitting unit 510 that emits infrared light and a sensing unit 520 that receives infrared light. The first infrared sensor 500 analyzes the intrinsic pattern of a target object by measuring the time taken for the infrared light emitted by the light emitting unit 510 to be received by the sensing unit 520.

Specifically, according to an embodiment, a fingerprint of a finger includes protruding ridges and concave valleys, and the time taken for infrared light emitted by the light emitting unit 510 to be received by the sensing unit 520 changes depending on which of the ridges and the valleys reflect the infrared light. The intrinsic pattern of the fingerprint can be analyzed by measuring the reflection time.

According to an embodiment, infrared light L1 emitted from the light emitting unit 510 propagates through the selective light-transmitting layer 70, is reflected by the target object, propagates back through the selective light-transmitting layer 70, and is then received by the sensing unit 520. As described above, since the selective light-transmitting layer 70 transmits infrared light, the infrared light L1 emitted from the light-emitting unit 510 is not blocked by the selective light-transmitting layer 70. In contrast, visible light L2 received from the outside is blocked by the selective light-transmitting layer 70. The visible light blocking effect by the selective light-transmitting layer 70 is experimentally confirmed for each wavelength with reference to FIG. 6.

Figure 6:
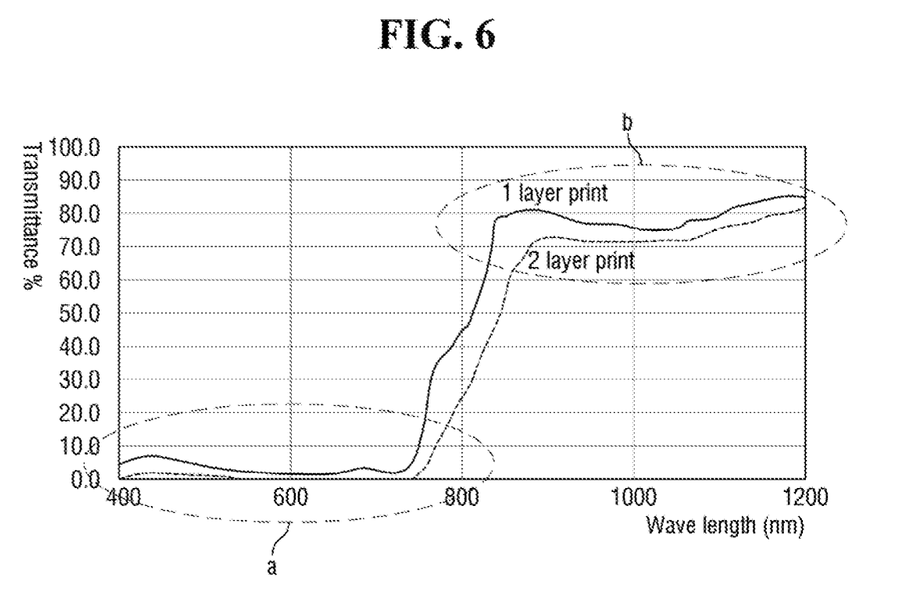
FIG. 6 is a graph of light transmittance as a function of wavelength by a selective light-transmitting layer according to an embodiment.

FIG. 6 is a graph of light transmittance as a function of wavelength by a selective light-transmitting layer according to an embodiment. In FIG. 6, the X-axis represents the wavelength (nm) of light, and the Y-axis represents the transmittance (%) of light of the selective light-transmitting layer 70.

In FIG. 6, according to an embodiment, the curved solid line represents the transmittance of light for each wavelength when the selective light-transmitting layer 70 is formed of one layer, and the curved dashed line represents the transmittance of light for each wavelength when the selective light-transmitting layer 70 is formed of two layers. Further, the region "a" refers to a visible light region (380 nm to 780 nm), and the region "b" refers to an infrared light region (850 nm to 1000 nm).

Referring to FIG. 6, according to an embodiment, it can be ascertained that the selective light-transmitting layer 70 blocks visible light in region "a", but transmits infrared light in region "b".

According to an embodiment, if a light-blocking layer that blocks all wavelengths of light, rather than the selective light-transmitting layer 40, is disposed beneath the display panel 10, infrared light L1 emitted from the first infrared sensor 500 will be blocked by the light-blocking layer, so that the first infrared sensor 500 will fail to perform its functions. To address this situation, if an opening is formed in the light-blocking layer that overlaps the first infrared sensor 500, not only infrared light L1 emitted by the first infrared sensor 500 but also visible light L2 received from the outside can propagate through the opening. The visible light L2 that has propagated through the opening is reflected from the lower surface of the display panel 10, and is viewed as external reflected light. In this case, a boundary forms between the region where the light-blocking layer is disposed and the region where the opening is formed in the light-blocking layer, thereby deteriorating the appearance quality of the display device.

In contrast, according to an embodiment, the selective light-transmitting layer 70 without an opening is disposed beneath the entire surface of the display panel 10. The selective light-transmitting layer 70 blocks visible light in region "a", so that external light is not reflected, thereby preventing the deterioration of the appearance quality of the display device. Further, the selective light-transmitting layer 70 transmits infrared light in region "b", thereby allowing the first infrared sensor 500 to perform its functions.

Hereinafter, display devices according to other embodiments will be described. In the following embodiments, a description of a same configuration as that of a previously described embodiment will be omitted or simplified, and differences will be mainly described.

Figure 7:
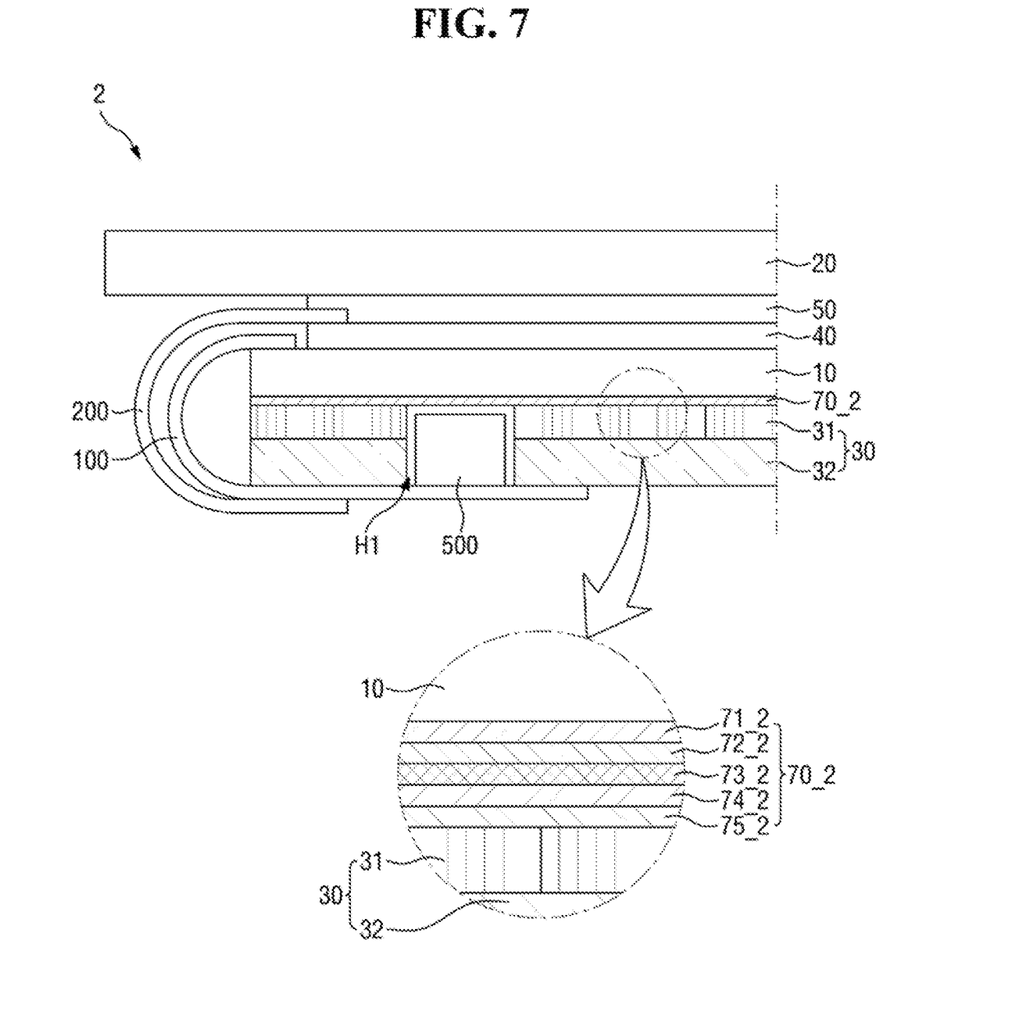
FIG. 7 is a cross-sectional view of a display device according to another embodiment.

FIG. 7 is a cross-sectional view of a display device according to another embodiment.

Referring to FIG. 7, according to an embodiment, a selective light-transmitting layer 70_2 of a display device 2 is provided in the form of a film.

According to an embodiment, selective light-transmitting layer 70_2 includes a plurality of film layers that have different refractive indexes. For example, the selective light-transmitting layer 70_2 includes first to fifth film layers 71_2 to 75_2 that have different refractive indexes. The first to fifth film layers 71_2 to 75_2 are sequentially laminated beneath the display panel 10. The first to fifth film layers 71_2 to 75_2 have substantially the same size as the display panel 10, and overlap the display panel 10.

According to an embodiment, the display panel 10 and the selective light-transmitting layer 70_2 are attached to each other by an adhesive member.

According to an embodiment, the lower surface of the selective light-transmitting layer 70_2 is exposed by the opening H formed in the panel bottom sheet 30. Specifically, the lower surface of the fifth film layer 75_2 is exposed by the opening H1, and the lower surface of the exposed fifth film layer 75_2 directly faces the first infrared sensor 500.

According to an embodiment, the first to fifth film layers 71_2 to 75_2 reflect different wavelengths of visible light, respectively, to prevent visible light from being transmitted. For example, the first film layer 71_2 reflects light of a wavelength near 400 nm, the second film layer 72_2 reflects light of a wavelength near 500 nm, the third film layer 73_2 reflects light of a wavelength near 600 nm, the fourth film layer 74_2 reflects light of a wavelength near 700 nm, and the fifth film layer 75_2 reflects light of a wavelength near 800 nm.

In contrast, according to an embodiment, since the first to fifth film layers 71_2 to 75_2 do not reflect infrared wavelengths, infrared light can propagate through the first to fifth film layers 71_2 to 75_2. The reflecting effect of the selective light-transmitting layer 70_2 for light of each wavelength is experimentally confirmed with reference to FIG. 8.

Figure 8:
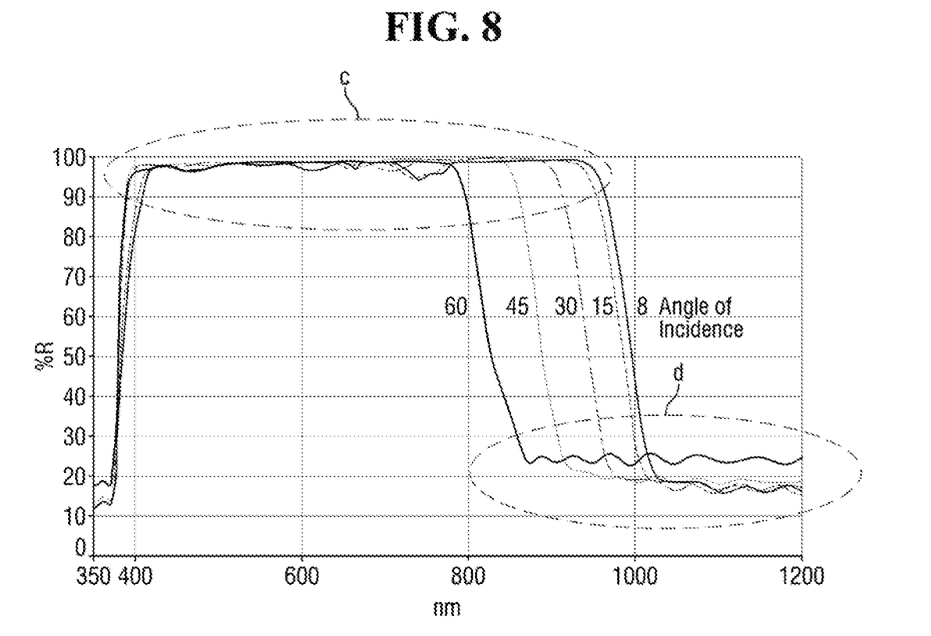
FIG. 8 is a graph of light reflectance as a function of wavelength by a selective light-transmitting layer according to another embodiment.

FIG. 8 is a graph of light reflectance of light as a function of wavelength by a selective light-transmitting layer according to another embodiment. In FIG. 8, the X-axis represents the wavelength (nm) of light, and the Y-axis represents the reflectance (%) of light of the selective light-transmitting layer 70_2.

In FIG. 8, according to an embodiment, the plurality of curved lines represents the light reflectance each wavelength for various incidence angles on the selective light-transmitting layer 70_2. In addition, region "c" indicates a visible light region (380 nm to 780 nm), and region "d" indicates an infrared light region (850 nm to 1000 nm).

Referring to FIG. 8, according to an embodiment, it can be ascertained that most of the light in the visible light region "c" is reflected by the selective light-transmitting layer 70_2, whereas most of the light in the infrared light region "d" is transmitted by the selective light-transmitting layer 70_2. That is, the selective light-transmitting layer 70_2 exhibits high reflectance for the visible light region "c", and exhibits low reflectance for the infrared light region "d".

Accordingly, according to an embodiment, infrared light emitted from the first infrared sensor 500 can propagate through the selective light-transmitting layer 70_2, so that the first infrared sensor 500 can perform its functions. On the other hand, external visible light cannot propagate through the selective light-transmitting layer 70_2, so that it is possible to prevent the lower structure of the display panel 10 from being visually recognized by a user.

Figure 9:
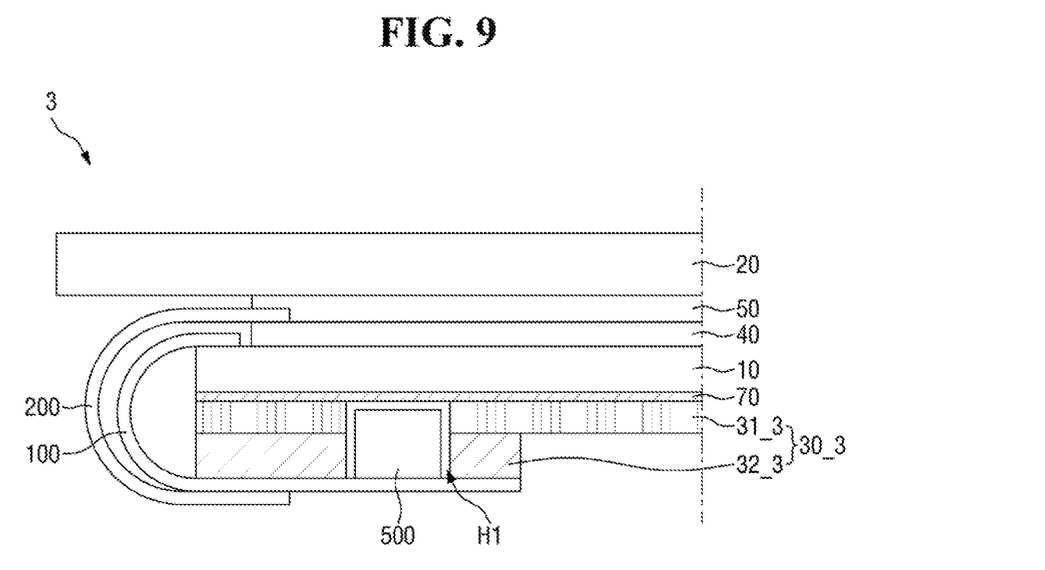
FIG. 9 is a cross-sectional view of a display device according to another embodiment.

FIG. 9 is a cross-sectional view of a display device according to still another embodiment.

Referring to FIG. 9, according to an embodiment, the size of a second functional layer 32_3 of a panel bottom sheet 30_3 of a display device 3 is smaller than the size of the display panel 10. Specifically, an embodiment of FIG. 9 differs from an above-described embodiment of FIG. 2 in that the second functional layer 32_3 is not disposed under the entire surface of the display panel 10, but is disposed only in an area adjacent to the first flexible circuit board 100.

According to an embodiment, the second functional layer 32_3 has a thickness greater than or equal to a predetermined thickness to compensate for the difference between the thickness of the first functional layer 31_3 and the height of the first infrared sensor 500. Specifically, when the height of the first infrared sensor 500 is greater than the thickness of the first functional layer 31_3, there may be insufficient space for the first infrared sensor 500 to be inserted and disposed in the first opening H1. Accordingly, if the sum of the thicknesses of the first functional layer 31_3 and the second functional layer 32_3 is greater than the height of the first infrared sensor 500, a space sufficient for the first infrared sensor 500 to be inserted can be secured.

Specifically, according to an embodiment, the thickness of the second functional layer 32_3 can be determined in based on the thickness of the first functional layer 313, the height of the first infrared sensor 500, and the distance d2 between the first infrared sensor 500 and the selective light-transmitting layer 70.

According to an embodiment, the second functional layer 32_3 overlaps the first flexible circuit board 100. Specifically, one end surface of the second functional layer 32_3 is aligned with an end surface of the first functional layer 31_3, and the other end surface of the second functional layer 32_3 is aligned with an end of the first flexible printed circuit 100.

In an embodiment, the second functional layer 32_3 is a foam type double-sided tape having a predetermined thickness. In this case, the second functional layer 32_3 attaches the first functional layer 31_3 to the first flexible circuit substrate 100 without a separate adhesive member. However, embodiments of the present disclosure are not limited thereto, and the second functional layer 32_3 can simultaneously perform various functions, such as a buffer member or a supporting member.

Figure 10:
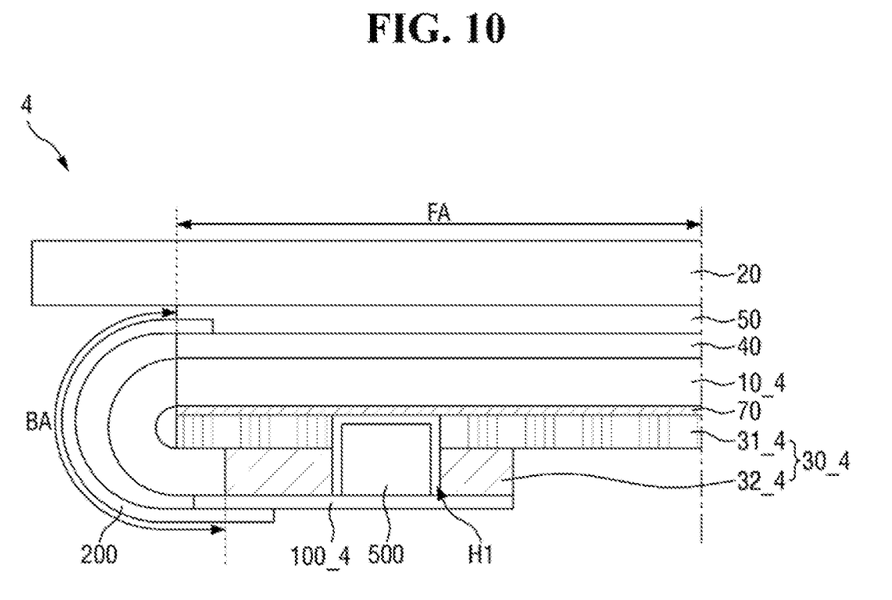
FIG. 10 is a cross-sectional view of a display device according to another embodiment.

FIG. 10 is a cross-sectional view of a display device according to another embodiment.

Referring to FIG. 10, according to an embodiment, a display panel 10_4 of a display device 4 includes a flexible substrate, and can thus be warped, bent, folded, or rolled.

In an embodiment, the display panel 10_4 includes a flat portion FA and a bendable portion BA. The bendable portion BA is bent in a direction opposite to a display direction, e.g., a backward direction in the case of a front light-emitting type, with respect to the flat portion FA. The bendable portion BA is disposed at one or more sides of the flat portion FA. A part of the display area DA and the non-display area NDA are disposed in the flat portion FA. Another part of the non-display area NDA is disposed in the bendable portion BA.

According to an embodiment, a first flexible circuit board 100_4 is attached to the bendable portion BA of the display panel 10_4 and is disposed on the lower surface of a panel bottom sheet 30_4. In this case, the first flexible circuit board 100_4 is not bent, unlike an embodiment of FIG. 3.

According to an embodiment, the panel bottom sheet 30_4 is disposed in the flat portion FA. A first functional layer 31_4 supports the display panel 10_4 so as not to bend in the flat portion FA.

According to an embodiment, the bendable portion of the display panel 10_4 is bent outward, so that a part of the lower surface of the display panel 10_4 is in contact with the lower surface of the first functional layer 31_4.

According to an embodiment, a second functional layer 32_4 is disposed adjacent to the end surface of the display panel 10_4. The thickness of the second functional layer 32_4 is substantially the same as the thickness of the display panel 10_4. The second functional layer 32_4 compensates for a height difference based on the distance between the first flexible circuit substrate 100_4 and the first functional layer 31_4, that is, based on the thickness of the display panel 10_4. The first flexible circuit board 100_4 is disposed beneath the second functional layer 32_4 in a flat shape without being warped or bent, and can be stably fixed.

According to an embodiment, the sum of the thickness of the first functional layer 31_4 and the thickness of the second functional layer 32_4 is greater than the height of the first infrared sensor 500. That is, when the total thickness of the panel bottom sheet 30_4 is greater than the height of the first infrared sensor 500, there is a sufficient space for the first infrared sensor 500 to be inserted and disposed in the first opening H1.

According to an embodiment, the selective light-transmitting layer 70 overlaps the flat portion FA of the display panel 10_4, and is not disposed on the bendable portion BA of the display panel 10_4. That is, the size of the selective light-transmitting layer 70 is smaller than the size of the display panel 10_4. The bendable portion BA of the display panel 10_4 is disposed in the non-display area NDA. In general, a light-blocking layer is disposed on the lower surface of the window 20 to overlap the non-display area NDA. Since external visible light is blocked by the light-blocking layer of the window 20, there is substantially no deterioration of appearance quality due to external reflected light even if the selective light-transmitting layer 70 is not disposed on the bendable portion BA of the display panel 10_4.

Figure 11:
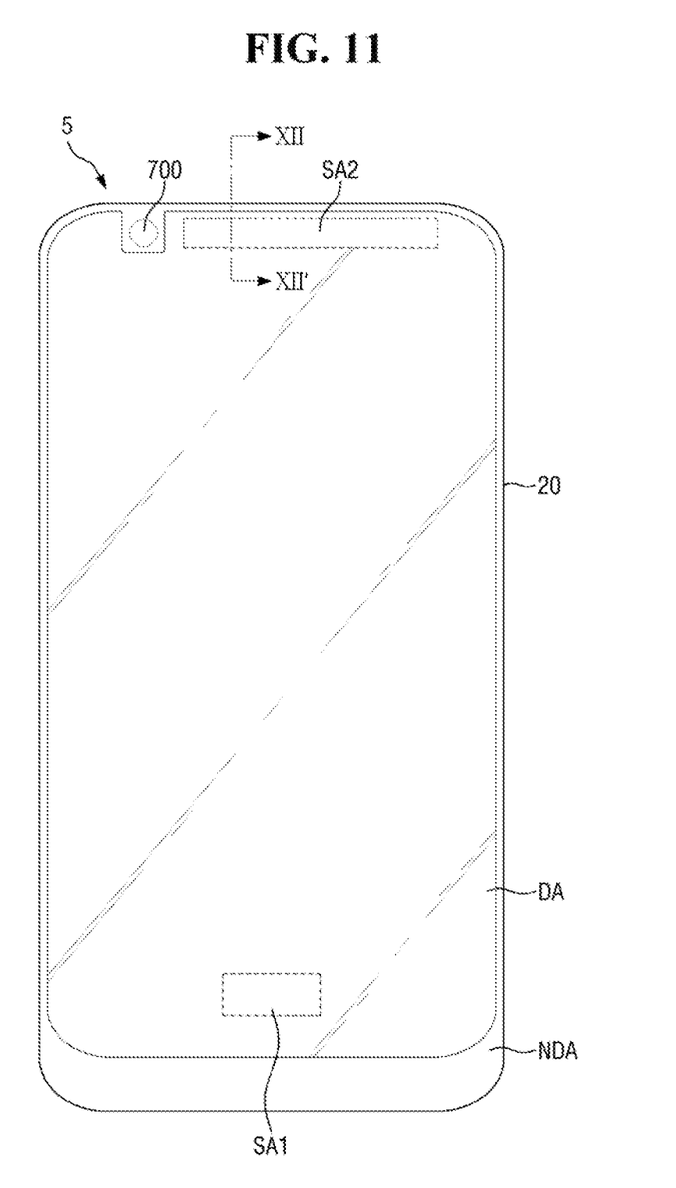
FIG. 11 is a plan view of a display device according to another embodiment.
Figure 12:
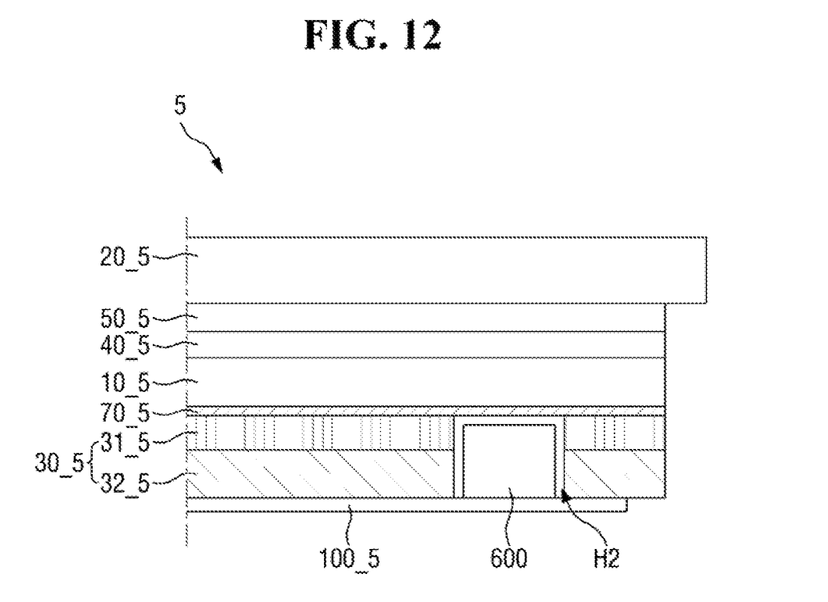
FIG. 12 is a cross-sectional view taken along line XII-XII' in FIG. 1I.

FIG. 11 is a plan view of a display device according to another embodiment. FIG. 12 is a cross-sectional view taken along the line XII-XII' in FIG. 11.

Referring to FIGS. 11 and 12, according to an embodiment, a display device 5 further includes a second sensing area SA2 in the display area DA.

According to an embodiment, the second sensing area SA2 is disposed in the display area DA adjacent to the non-display area NDA. A second infrared sensor 600, such as an iris recognition sensor or a proximity sensor, is disposed in the second sensing area SA2.

According to an embodiment, a panel bottom sheet 30_5 includes a second opening H2 that overlaps the second sensing area SA2. The second opening H2 exposes a lower surface of a selective light-transmitting layer 70_5.

According to an embodiment, the second infrared sensor 600 is inserted and disposed in the second opening H2. The second infrared sensor 600 directly faces the lower surface of the selective light-transmitting layer 70_5 exposed by the second opening H2.

According to an embodiment, the second infrared sensor 600, similar to the first infrared sensor 500, is mounted on a first flexible circuit board 100_5. In this case, the first flexible circuit board 100_5 extends from the first sensing area SA1 to the second sensing area SA2. In the display device 1 according to an embodiment of FIG. 2, the first flexible circuit board 100 is disposed adjacent to the first sensing area SA, but in the display device 5 according to an embodiment of FIG. 11, the first flexible circuit board 100_5 extends from the first sensing area SA1 to the second sensing area SA2.

According to an embodiment, the end of the first flexible circuit board 100_5 is positioned inward with respect to an end surface of the panel bottom sheet 30_5. However, embodiments of the present disclosure are not limited thereto, and the end of the first flexible circuit board 100_5 can be substantially aligned with the end surface of the panel bottom sheet 30_5.

In addition, in another embodiment, the second infrared sensor 600 is disposed under a bracket disposed under the panel bottom sheet 30_5. In this case, the bracket is provided with an opening in which the second infrared sensor 600 can be disposed, and the second infrared sensor 600 is mounted on a separate printed circuit board instead of the first flexible circuit board 100_5.

According to an embodiment, when the second sensing area SA2 is disposed in the display area DA, the non-display area NDA is reduced, and thus a bezel can be reduced. That is, the display device 5 can utilize all remaining areas, except for an imaging device 700 that uses visible light, as the display area DA. Accordingly, since most of the area of the display device 5 can be utilized as the display area DA, a bezel-less display device 5 having a minimized bezel can be realized.

According to embodiments, an opening is formed in an inorganic material, thereby preventing cracks from propagating into the display device. Further, a substrate exposed through the opening is in direct contact with an organic material, thereby increasing a bonding force therebetween.

Although exemplary embodiments of the present disclosure have been disclosed for illustrative purposes, those skilled in the art will appreciate that various modifications, additions and substitutions are possible, without departing from the scope and spirit of the embodiments of the disclosure as disclosed in the accompanying claims.

What is claimed is:

1. A display device, comprising:
a display panel that includes a display area and a non-display area that surrounds the display area;
a selective light-transmitting layer that is the same size as the display panel and is disposed under the display panel that blocks visible light and transmits infrared light;
a panel bottom sheet that is the same size as the display panel and is disposed under the selective light-transmitting layer that includes a first opening in the display area that exposes the selective light-transmitting layer; and
a first infrared sensor inserted in the first opening.

2. The display device of claim 1,
wherein the first infrared sensor is one of a fingerprint recognition sensor, an iris recognition sensor, or a proximity sensor.

3. The display device of claim 1,
wherein the first opening has a size that is larger than that of the first infrared sensor.

4. The display device of claim 1,
wherein the selective light-transmitting layer includes a plurality of film layers that have refractive indexes that differ from each other.

5. The display device of claim 4,
wherein the plurality of film layers reflect visible light wavelengths and transmit infrared light wavelengths.

6. The display device of claim 1, further comprising:
a flexible circuit board attached to the display panel,
wherein the panel bottom sheet includes a plurality of functional layers.

7. The display device of claim 6,
wherein the first infrared sensor is mounted on the flexible circuit board.

8. The display device of claim 6,
wherein the panel bottom sheet includes a first functional layer attached to a bottom surface of the selective light-transmitting layer, and a second functional layer below the first functional layer.

9. The display device of claim 8,
wherein the first functional layer performs a buffer function that alleviates external impacts, and the second functional layer performs a digitizer function that converts positional information into a digital signal.

10. The display device of claim 8,
wherein the first functional layer and the second functional layer overlap a front surface of the display panel.

11. The display device of claim 8, wherein a part of the flexible circuit board is disposed on a lower surface of the second functional layer of the panel bottom sheet,
wherein the panel bottom sheet includes a first region that overlaps the flexible circuit board and a second region that does not overlap the flexible circuit board, and
the second functional layer is disposed on the first region.

12. The display device of claim 6,
wherein the panel bottom sheet further includes a second opening in the display area that exposes the selective light-transmitting layer.

13. The display device of claim 12, further comprising:
a second infrared sensor inserted in the second opening,
wherein the first infrared sensor and the second infrared sensor are disposed on the flexible circuit board, and the second infrared sensor is an iris recognition sensor or a proximity sensor.

14. A display device, comprising:
a display panel that includes a flat portion and a bendable portion around the flat portion;
a selective light-transmitting layer that is the same size as the flat portion and is disposed under the display panel that overlaps the flat portion, blocks visible light and transmits infrared light;
a panel bottom sheet that is the same size as the flat portion and is disposed under the selective light-transmitting layer that includes an opening in the flat, portion that exposes the selective light-transmitting layer; and
an infrared sensor inserted in the opening.

15. The display device of claim 14,
wherein the infrared sensor is one of a fingerprint recognition sensor, an iris recognition sensor, or a proximity sensor.

16. The display device of claim 14,
wherein the opening has a size that is larger than that of the infrared sensor.

17. The display device of claim 14, further comprising:
a flexible circuit board attached to the display panel,
wherein the infrared sensor is mounted on the flexible circuit board.

18. A display device, comprising:
a display panel that includes a display area and a non-display area that surrounds the display area;
a selective light-transmitting layer that is the same size as the display panel and is that blocks visible light and transmits infrared light;
a panel bottom sheet that is the same size as the display panel and is disposed under the selective light-transmitting layer that includes a first opening that exposes the selective light-transmitting layer;
a first infrared sensor inserted in the first opening, and
a flexible circuit board disposed under the panel bottom sheet,
wherein the first infrared sensor is mounted on the flexible circuit board.

19. The display device of claim 18, wherein the first opening has a size that is larger than that of to first infrared sensor.

20. The display device of claim 18, wherein
the display panel is disposed on the selective light-transmitting layer;
wherein the first opening is disposed in the display area, and
the flexible circuit board is bent from lower surface of the panel bottom sheet to an upper surface of the display panel.

* * * * *